US009455547B2

(12) United States Patent
Kuramoto et al.

(10) Patent No.: US 9,455,547 B2
(45) Date of Patent: Sep. 27, 2016

(54) SEMICONDUCTOR LASER DEVICE

(71) Applicant: Mitsubishi Electric Corporation, Tokyo (JP)

(72) Inventors: Kyosuke Kuramoto, Tokyo (JP); Takayuki Yanagisawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/890,084

(22) PCT Filed: May 13, 2013

(86) PCT No.: PCT/JP2013/063294
§ 371 (c)(1),
(2) Date: Nov. 9, 2015

(87) PCT Pub. No.: WO2014/184844
PCT Pub. Date: Nov. 20, 2014

(65) Prior Publication Data
US 2016/0099543 A1 Apr. 7, 2016

(51) Int. Cl.
*H01S 3/04* (2006.01)
*H01S 5/022* (2006.01)
*H01S 5/068* (2006.01)
*H01S 5/024* (2006.01)
*H01S 5/32* (2006.01)
*H01S 5/323* (2006.01)

(52) U.S. Cl.
CPC .......... *H01S 5/02236* (2013.01); *H01S 5/022* (2013.01); *H01S 5/024* (2013.01); *H01S 5/0224* (2013.01); *H01S 5/02469* (2013.01); *H01S 5/06817* (2013.01); *H01S 5/3214* (2013.01); *H01S 5/32316* (2013.01)

(58) Field of Classification Search
CPC ............ H01S 5/02236; H01S 5/0224; H01S 5/32316; H01S 5/02469; H01S 5/024; H01S 5/022; H01S 5/06817
USPC ..................................... 372/36, 34
See application file for complete search history.

(56) References Cited

U.S. PATENT DOCUMENTS

2002/0136250 A1* 9/2002 Roellig ................... H01S 5/024
372/36

(Continued)

FOREIGN PATENT DOCUMENTS

| EP | 0590232 A1 | 4/1994 |
| JP | H06-112596 A | 4/1994 |
| JP | 2004-047096 A | 2/2004 |
| JP | 2006-013038 A | 1/2006 |

(Continued)

OTHER PUBLICATIONS

International Search Report, PCT/JP2013/063294, Aug. 6, 2013.

*Primary Examiner* — Kinam Park
(74) *Attorney, Agent, or Firm* — Studebaker & Brackett PC

(57) ABSTRACT

In at least one opening of a plurality of openings 10a and 10b, the following inequality is satisfied:

$$x \leq \tfrac{1}{2} \cdot t \cdot (kx/ky)$$

where x represents a minimum distance in a horizontal direction between an end of the one opening and an end of a submount 8, and t represents a thickness of the submount, and
in at least one of the other openings different from the one opening, the following inequality is satisfied:

$$x > \tfrac{1}{2} \cdot t \cdot (kx/ky).$$

6 Claims, 6 Drawing Sheets

(56) References Cited

U.S. PATENT DOCUMENTS

| | | | |
|---|---|---|---|
| 2002/0150133 A1* | 10/2002 | Aikiyo | H01S 5/02415 372/36 |
| 2005/0286592 A1 | 12/2005 | Shimada et al. | |
| 2007/0297469 A1* | 12/2007 | Brown | H01S 3/042 372/34 |
| 2008/0205459 A1 | 8/2008 | Yonekubo | |
| 2009/0067466 A1 | 3/2009 | Miyazaki | |
| 2010/0007013 A1* | 1/2010 | Kuroda | H01L 23/367 257/712 |
| 2011/0211604 A1* | 9/2011 | Roscher | G02B 6/423 372/35 |

FOREIGN PATENT DOCUMENTS

| | | |
|---|---|---|
| JP | 2007-019265 A | 1/2007 |
| JP | 2007-088266 A | 4/2007 |
| JP | 2007-095736 A | 4/2007 |
| JP | 2008-004743 A | 1/2008 |
| JP | 2008-205342 A | 9/2008 |
| JP | 2008-258515 A | 10/2008 |
| JP | 2009-064961 A | 3/2009 |
| JP | 2009-111230 A | 5/2009 |
| JP | 4342495 B2 | 10/2009 |
| JP | 4376578 B2 | 12/2009 |
| WO | 2008/053586 A1 | 5/2008 |

* cited by examiner

Distance x between Active Layer End and Submount End / Submount Thickness t

Distance x between Active Layer End and Submount End / Submount Thickness t

Distance x between Active Layer End and Block End
/ Submount Thickness t

SEMICONDUCTOR LASER DEVICE

TECHNICAL FIELD

The present invention relates to a semiconductor laser device for use in a light source of a projector device, or the like.

BACKGROUND ART

A device for displaying a color image such as a projector device or a projection TV requires light sources of three colors of R (red), G (green), and B (blue) as light sources. There is a case in which a semiconductor laser element with a high luminous efficiency is used as the light source. As one of characteristics of a semiconductor laser, it is specified that its output light is coherent in phase, in other words, a high coherence; however, due to this, there arises a problem of appearance of a speckle pattern on a projected surface, a so-called speckle noise.

Thus, as one method of reducing the speckle noise, a means is adopted that a plurality of wavelengths are mixed to reduce the coherence.

Conventionally, as such a device for oscillating the plurality of wavelengths at the same time to reduce the speckle noise, there is the one including: a semiconductor laser for generating a laser beam with a wavelength λ1, and a semiconductor laser for generating a laser beam with a wavelength λ2 different from the wavelength λ1. Since the wavelength λ1 and wavelength λ2 are different from each other by about several nm to several ten nm, it is difficult to visually distinguish the difference in wavelength between the two beams, and hence the two beams look like the one of the same color. On the other hand, reduction of the coherence can obtain an effect of reducing the speckle noise.

Further, as a method for obtaining the plurality of wavelengths, there is also a method in which a plurality of active layers are crystal grown on one substrate as shown in Patent Document 1 or Patent Document 2.

CITATION LIST

Patent Document

Patent Document 1: Japanese Patent Application Laid-open No. 2007-95736
Patent Document 2: Japanese Patent Application Laid-open No. 2004-47096

SUMMARY OF THE INVENTION

Problems to be Solved by the Invention

However, for the aforementioned conventional one including semiconductor lasers having different wavelengths, semiconductor laser elements of different wavelengths are required to be manufactured. Here, since the oscillation wavelength of the semiconductor laser is changed such that the material composition and the film thickness of the active layer that is a light emitting layer are changed, crystal growth thereof is required to be carried out separately. Further, since the plurality of semiconductor laser elements are required to be assembled, there is a problem such that the manufacturing costs and assembly costs for the elements increase.

Further, as shown in Patent Document 1 or Patent Document 2, when the plurality of active layers are crystal grown on one substrate, the crystal growth is required to be carried out a plurality of times, and it is further necessary to grow one active layer thereof, followed by removal of a part thereof, or to provide a region not subjected to the crystal growth using a selective growth method or the like when the one active layer is crystal grown. However, these methods each require a complicated process, inevitably resulting in an increase in cost or a deterioration of the yield.

The present invention is made to solve the foregoing problems, and an object thereof is to provide a semiconductor laser device capable of suppressing the speckle noise at low cost and with ease.

Means for Solving the Problems

A semiconductor laser device of the invention includes: a submount having a thermal conductivity of kx in a horizontal direction, and a thermal conductivity of ky in a vertical direction that is joined on a heat sink; and a laser element having a plurality of light emitting regions resulting from a plurality of openings for a single laser element, and being mounted on the submount such that a side of the element having an active layer faces a side of the submount, wherein in at least one opening of the plurality of openings, the following inequality is satisfied:

$$x \leq \tfrac{1}{2} \cdot t \cdot (kx/ky)$$

where x represents a minimum distance in the horizontal direction between an opening end of the one opening and an end of the submount, and t represents a thickness of the submount, and in at least one of the other openings different from the one opening, the following inequality is satisfied:

$$x > \tfrac{1}{2} \cdot t \cdot (kx/ky).$$

Effect of the Invention

In the semiconductor laser device of the invention, since it is configured that the distance between the opening end of the plurality of openings and the submount end is defined, a semiconductor laser device capable of suppressing the speckle noise at low cost and with ease can be obtained.

MODES FOR CARRYING OUT THE INVENTION

In the following, in order to describe the present invention in more detail, modes for carrying out the invention will be described with reference to the accompanying drawings.

Embodiment 1

Figure 1:
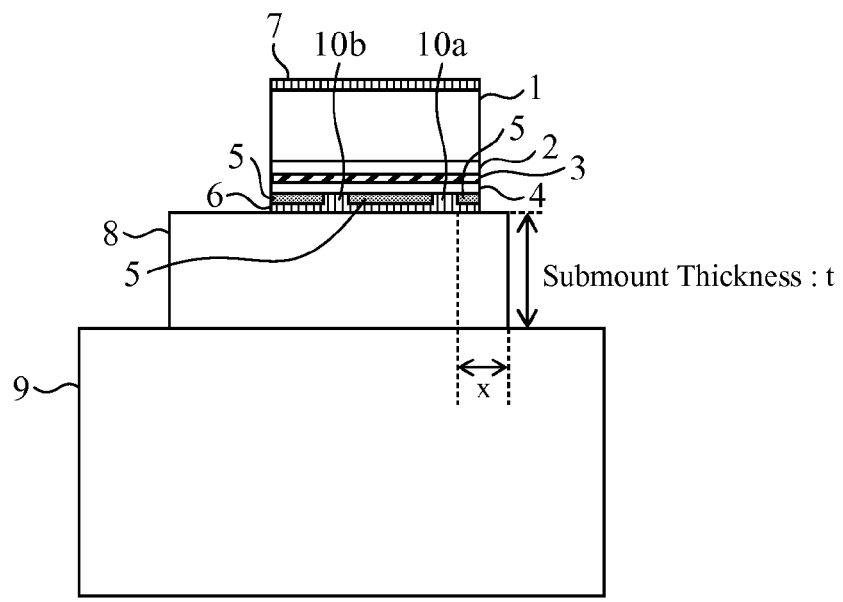
FIG. 1 is a constitution diagram of a semiconductor laser device of Embodiment 1 of the present invention.

FIG. 1 is a constitution diagram of a semiconductor laser device in accordance with the present embodiment, and shows the semiconductor laser device as seen from the front thereof.

The illustrated semiconductor laser device includes an n-type GaAs substrate 1, an n-type AlInP cladding layer 2, an active layer 3, a p-type AlInP cladding layer 4, a SiN insulation film 5, a p-side electrode 6, an n-side electrode 7, a submount 8, and a heat sink 9.

The thickness of the n-type GaAs substrate 1 is about 100 µm; the thickness of the n-type AlInP cladding layer 2 is 1.5 µm; and the active layer 3 has a constitution in which a 10-nm thick undoped GaInP light emitting layer is interposed between two layers of a 200-µm thick undoped AlGaInP optical guide layer, and forms a quantum well. The thickness of the p-type AlInP cladding layer 4 is 1.0 µm; the thickness of the SiN insulation film 5 is 10 nm; the p-side electrode 6 is about 2 µm in thickness; and the n-side electrode 7 is about 2 µm in thickness. For crystal growth of the semiconductor lamination structure, for example, MOCVD (Metal Organic Chemical Vapor Deposition) is used.

The depth direction of the paper plane is the optical path direction of the laser beam. The resonator length is 1.5 mm. The SiN insulation film 5 is provided with two openings (first opening 10a and second opening 10b) by etching in the resonator direction on the light emitting region of the laser. The p-side electrode 6 and the element surface of the semiconductor laser are in contact with each other at the first opening 10a and the second opening 10b; as a result, a current is injected into only that portion to form an oscillation region.

On the other hand, the heat generation to be generated at the time of an operation of the above semiconductor laser includes mainly the following three: the heat generation by the non-emitting recombination not contributing to the light emission at the light emitting layer in the active layer 3; the heat generation by absorption of the laser beam at the n-type AlInP cladding layer 2, the active layer 3, and the p-type AlInP cladding layer 4; and the Joule heat generated due to the flow of the current through the semiconductor layer. Here, in the inside of the semiconductor layer, the resistance of the p-type AlInP cladding layer 4 is larger than that of the others. For this reason, most of the Joule heat is generated at the p-type AlInP cladding layer 4.

Here, taking into consideration the gap between the active layer 3 and the semiconductor surface is very thin to be about 1 µm; the current is injected into only the openings of the SiN insulation film 5; and the oscillation region in which the laser beam is generated is only the openings, it can be safely considered that the heat generations are generated in only the vicinity of the openings of the SiN insulation film 5, and that the width of the heat generation region is substantially equal to the width of the openings.

The semiconductor laser element is solder joined to the submount 8 of an aluminum nitride (AlN) material by junction down with the p-side down. The thermal conductivities of the submount 8 are all the same in the three directions of the vertical direction, the horizontal direction, and the vertical direction to the paper plane, and are isotropic. The submount 8 is solder joined to the heat sink 9 formed of copper for heat radiation.

Figure 2:
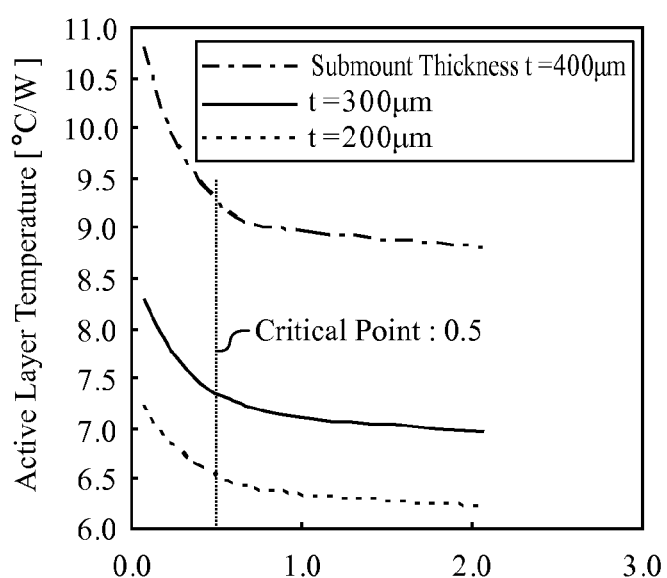
FIG. 2 is an explanatory diagram showing results determined by thermal simulation of active layer temperature in the semiconductor laser device of Embodiment 1 of the invention.

Here, as shown in FIG. 1, in the first opening 10a which is one of the two openings, a horizontal distance between an opening end closer to a submount end and the submount end is referred to as x, and a submount thickness is referred to as t. By application of a thermal simulation with a three-dimensional finite element method to the above structure, the temperature of the active layer on the first opening 10a was determined when the heat generation was caused at the first opening 10a, and the results are shown in FIG. 2. Here, the horizontal axis shows x/t, and the vertical axis shows the temperature increase amount of the active layer when the heat generation per 1 W is caused. The submount thickness t shows three cases of 200, 300, and 400 µm. The thermal conductivity of the submount 8 was set at 230 W/m·K of the thermal conductivity of the sintered body AlN.

As shown in FIG. 2, it is indicated as follows: when x/t is larger, in other words, when the opening end is more distant from the submount end, x dependency of the temperature of the active layer 3 is smaller, whereas, when x/t is smaller, in other words, as the opening end approaches the submount end, the temperature sharply increases. For the temperature increase, in the cases of all the submount thicknesses, the point of x/t=0.5 is a boundary.

From the above, when at the first opening 10a, x/t is set at 0.5 or less, and at the second opening 10b, x/t is set at 0.5 or more, the active layer temperature over the first opening 10a can be set higher than the active layer temperature on the second opening 10b. Here, in the semiconductor laser, when the temperature of the light emitting layer serving as a laser oscillation medium is higher, a bandgap thereof is smaller, so that the oscillation wavelength is longer. Therefore, the laser beam from the active layer 3 on the first opening 10a is longer in wavelength than the laser beam from the active layer 3 on the second opening 10b; as a result, it becomes possible to obtain the laser oscillation beam with two wavelengths from the one element.

Figure 3:
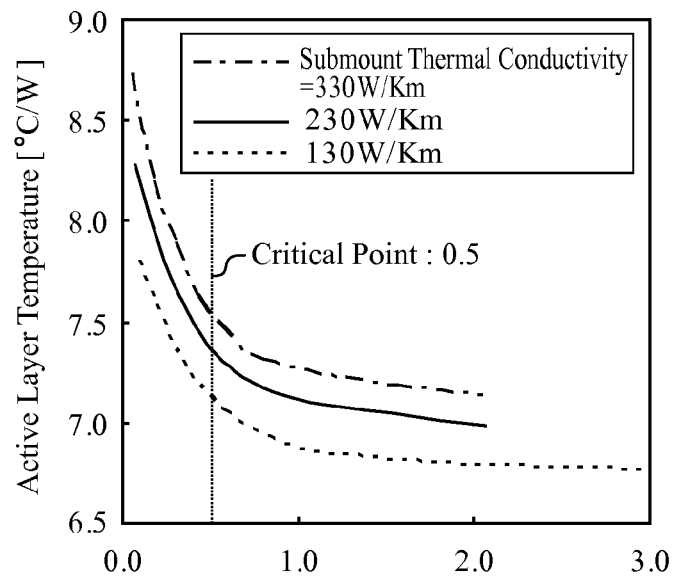
FIG. 3 is an explanatory diagram showing the results determined by the thermal simulation of the active layer temperature when thermal conductivities of a submount in the semiconductor laser device of Embodiment 1 of the invention are different.

Next, for each of cases where the submount thickness was set at 300 µm, and where the thermal conductivities of the submount 8 were 130, 230, and 330 W/m·K, the same thermal simulation was carried out, and the results are shown in FIG. 3. Also in this case, it is indicated that x/t=0.5 becomes a critical value in all the cases.

From the results shown in FIGS. 2 and 3, it is indicated that the condition in which the active layer temperature increases rapidly, namely, $x/t \leq 0.5$, does not depend upon the thickness of the submount 8 and the thermal conductivity of the submount 8.

Thus, the reason why the critical value of x/t has a universality can be explained as follows.

Figure 4:
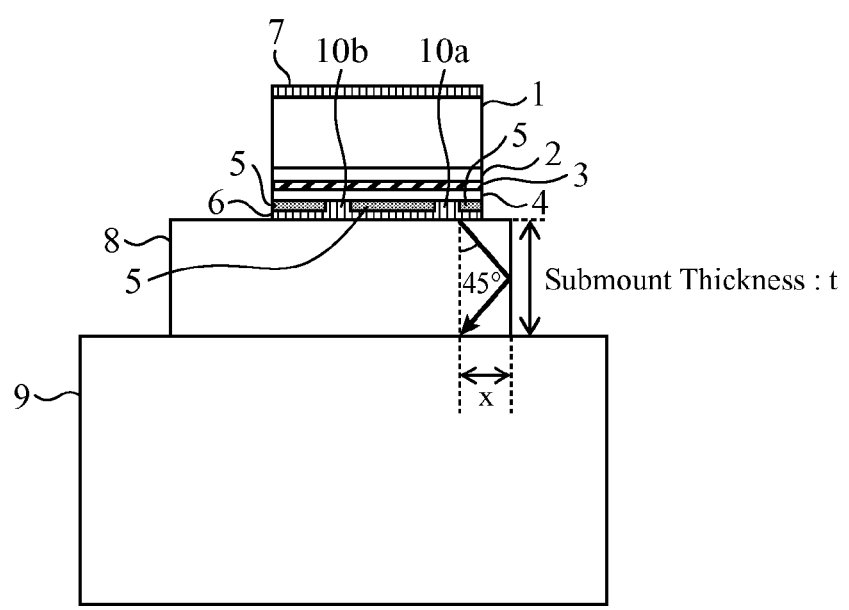
FIG. 4 is a constitution diagram for illustrating a reason for presence of a critical point in the semiconductor laser device of Embodiment 1 of the invention.

FIG. 4 is a constitution diagram of the device when $x/t=0.5$ as seen from the front thereof. Here, since the thermal conductivity of the submount 8 has an isotropy, the heat generated at the right end of the first opening 10*a* is diffused in the right lateral direction at a radiation angle of 45°. The heat diffused in this direction is reflected at the submount end, and is diffused into the left direction; consequently, when that heat reaches the lower surface of the submount, namely when it is diffused in the downward direction by the distance of t, in the case where $x/t>0.5$, it is diffused into the heat sink 9 without reaching the right end of the first opening 10*a*. On the other hand, in the case where $x/t \leq 0.5$, the heat reflected at the submount end reaches the position of the right end of the first opening 10*a*, in other words, the position at the distance x from the submount end. This means that the heat reaches through the shortest heat path from the right end of the first opening 10*a* to the heat sink, and thus, in such a case, the temperature of the active layer 3 on the first opening 10*a* largely increases.

Then, the laser device as shown in FIG. 1 was manufactured. The opening width of the first opening 10*a* and the second opening 10*b* was 70 μm, the distance between the opening centers was 200 μm, and the width of the laser element was 400 μm. The submount thickness was set at 240 μm, and the distance between the opening end of the first opening 10*a* and the submount end was set at 50 μm. x/t was 50/240=0.21. The distance between the opening end of the second opening 10*b* and the submount end was set at 500 μm.

Figure 5:
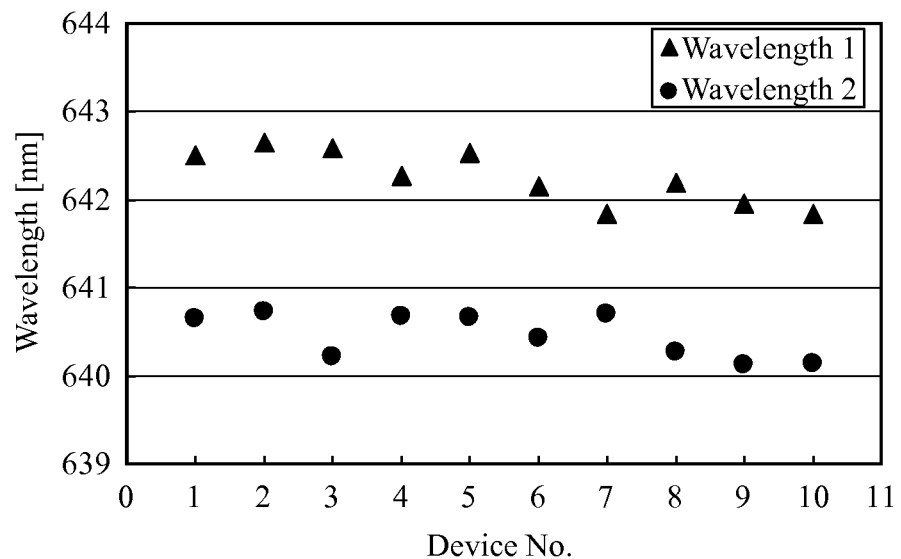
FIG. 5 is an explanatory diagram showing results of wavelength measurement in the semiconductor laser device of Embodiment 1 of the invention.
Figure 6:
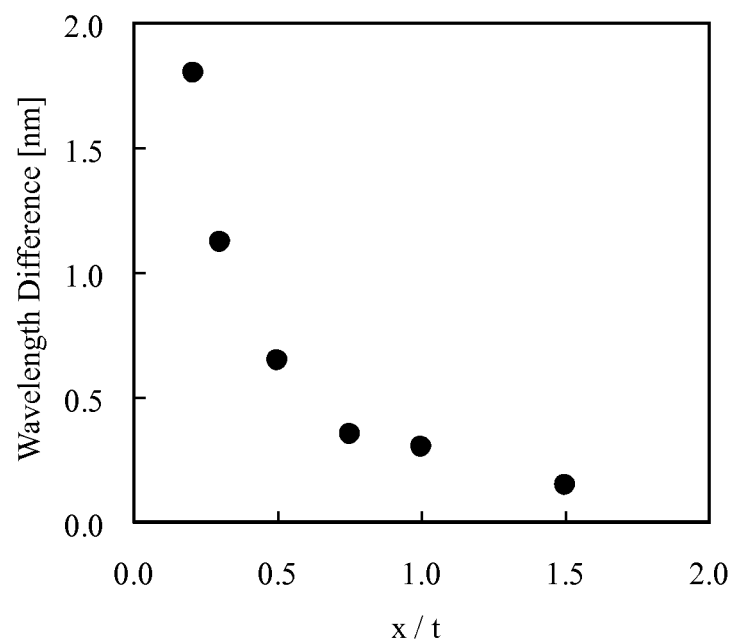
FIG. 6 is an explanatory diagram summarizing the results of the wavelength measurement in the semiconductor laser device of Embodiment 1 of the invention.

In the case where the ten laser devices described above were applied with a current of 6 A, the wavelengths of the laser beams generated from the two light emitting regions were measured using a fiber equipped with a lens. The measurement results of the respective wavelengths are shown in FIG. 5. The difference between the two wavelengths was an average of 1.8 nm. Similarly, a laser device was manufactured using x/t as a parameter, and the difference between the two wavelengths was measured, and the results are shown in FIG. 6.

Thus, in the semiconductor laser device in accordance with the present embodiment, when the temperature of the partial light emitting region is set higher than the temperature of the other light emitting region, the oscillation wavelength is made longer to thereby obtain the oscillation beam having the plurality of wavelengths. In addition, also with the device constitution, the position of the laser element is just changed from the conventional one, which enables easy manufacturing thereof.

Here, the distance between the right end of the first opening 10*a* and the submount end when $x/t=0.5$ of the critical condition is satisfied is often very small to be around 100 μm. For this reason, one opening (the first opening 10*a* in the drawing) is preferably set closer to the laser element end as shown in FIG. 1.

Further, if the thermal conductivity of the material for the submount 8 has an anisotropy, in other words, the horizontal thermal conductivity kx and the vertical thermal conductivity ky are different, the heat conduction is effected not at 45° but at an angle of $$\theta = \tan^{-1}(kx/ky)[\text{deg.}].$$

Therefore, in this case, the critical point x is expressed as follows with respect to the distance between the opening position and the submount end such that the temperature increase of the active layer increases:

$$x = \frac{1}{2} \cdot t \cdot \tan \theta = \frac{1}{2} \cdot t \cdot (kx/ky)$$

where t denotes the submount thickness.

Incidentally, in the present embodiment, there is shown the example in a monolithic structure in which the two light emitting points (light emitting regions resulting from the openings) are formed in the one laser element. However, the same also applies to a structure in which there are arranged two laser elements each including only one light emitting point formed therein. Further, in this case, the two laser elements may be arranged on one submount, or the one submount may be used for each laser element. Further, in the present embodiment, the description is given to the case of the two light emitting points. However, the same effects can be produced also when the element has a plurality of, three or more light emitting points.

As described above, according to the semiconductor laser device of Embodiment 1, the laser device is configured to include: the submount having the thermal conductivity of kx in the horizontal direction, and the thermal conductivity of ky in the vertical direction that is joined on the heat sink; and the laser element having the plurality of light emitting regions resulting from the plurality of openings for the single laser element, and being mounted on the submount such that the element side having the active layer faces the submount side, wherein in at least one opening of the plurality of openings, the following inequality is satisfied:

$$x \leq \frac{1}{2} \cdot t \cdot (kx/ky)$$

where x represents the minimum distance in the horizontal direction between the opening end and the submount end, and t represents the submount thickness, and in at least one of the other openings different from the one opening, the following inequality is satisfied:

$$x > \frac{1}{2} \cdot t \cdot (kx/ky).$$

Accordingly, only changing the assembly shape thereof enables to obtain the plurality of wavelengths at the same time, and the manufacturing cost and assembly cost become entirely the same as the conventional. Further, also with the assembly, since only the assembly position is changed, it becomes possible to obtain the semiconductor laser device capable of suppressing speckle noise at low cost and with ease.

Further, according to the semiconductor laser device of Embodiment 1, in place of the laser element having the plurality of light emitting regions in the single laser element, the plurality of laser elements each having the light emitting region resulting from the single opening for the laser element are provided on the submount, and the respective openings are set as the plurality of openings. Accordingly, even when the plurality of elements are used, the elements may have the same wavelength and thus, it becomes possible to reduce the manufacturing cost for the element.

Further, according to the semiconductor laser device of Embodiment 1, the laser device is configured to include: the submount having the isotropic thermal conductivity in the horizontal direction and the vertical direction that is joined on the heat sink; and the laser element having the plurality of light emitting regions resulting from the plurality of openings for the single laser element, and being mounted on the submount such that the element side having the active layer faces the submount side, wherein in at least one opening of the plurality of openings, the following inequality is satisfied: $x/t \leq 0.5$, where x represents the minimum distance in the horizontal direction between the opening end and the submount end, and t represents the submount thickness, and in at least one of the other openings different from the one opening, the following inequality is satisfied: $x/t > 0.5$. Accordingly, the semiconductor laser device capable of suppressing the speckle noise at low cost and with ease can be obtained.

Embodiment 2

Figure 7:
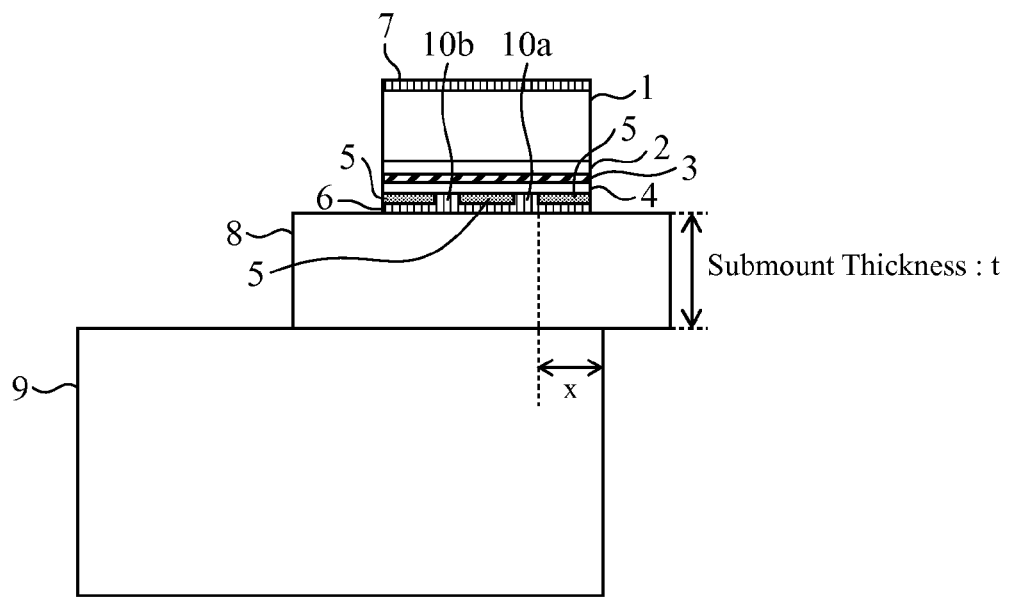
FIG. 7 is a constitution diagram of a semiconductor laser device of Embodiment 2 of the invention.

FIG. 7 is a constitution diagram of a semiconductor laser device in Embodiment 2 as seen from the front thereof. The illustrated semiconductor laser device includes an n-type GaAs substrate 1, an n-type AlInP cladding layer 2, an active layer 3, a p-type AlInP cladding layer 4, a SiN insulation film 5, a p-side electrode 6, an n-side electrode 7, a submount 8, and a heat sink 9. The constituent elements are the same as those of Embodiment 1; however, a positional relationship among the laser element, submount 8, and heat sink 9 is different.

Figure 8:
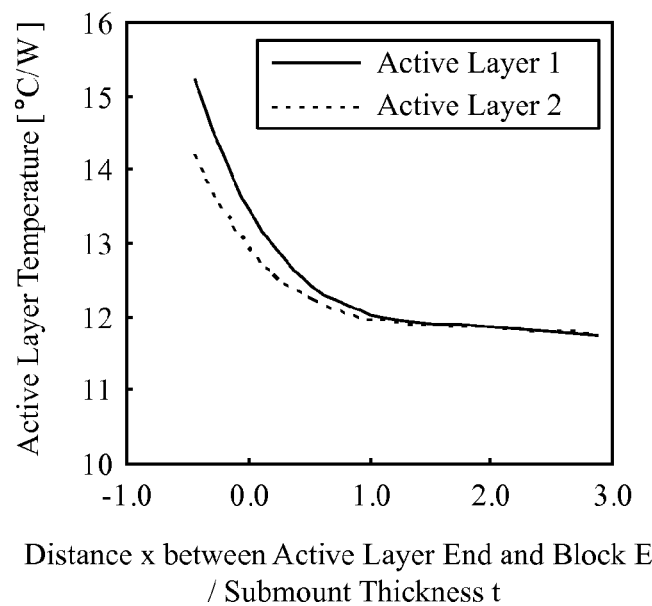
FIG. 8 is an explanatory diagram showing results determined by thermal simulation of active layer temperature in the semiconductor laser device of Embodiment 2 of the invention.

Here, as shown in FIG. 7, a distance between the right end of the first opening 10a which is one of the two openings, and the right end of the heat sink 9 is referred to as x, and a submount thickness is referred to as t. By application of a thermal simulation with a three-dimensional finite element method to the above structure, determined were the temperatures of the active layer (which is referred to as an active layer 3a) on the first opening 10a and the active layer (which is referred to as an active layer 3b) on the second opening 10b when a heat generation was caused at the first opening 10a and the second opening 10b, and the results are shown in FIG. 8. Here, the horizontal axis shows x/t, and the vertical axis shows the temperature increase amount of the active layer when the heat generation per 1 W is caused at each active layer. The submount thickness t was set at 300 µm. The thermal conductivity of the submount 8 was set at 230 W/m·K of the thermal conductivity of the sintered body AlN.

Figure 9:
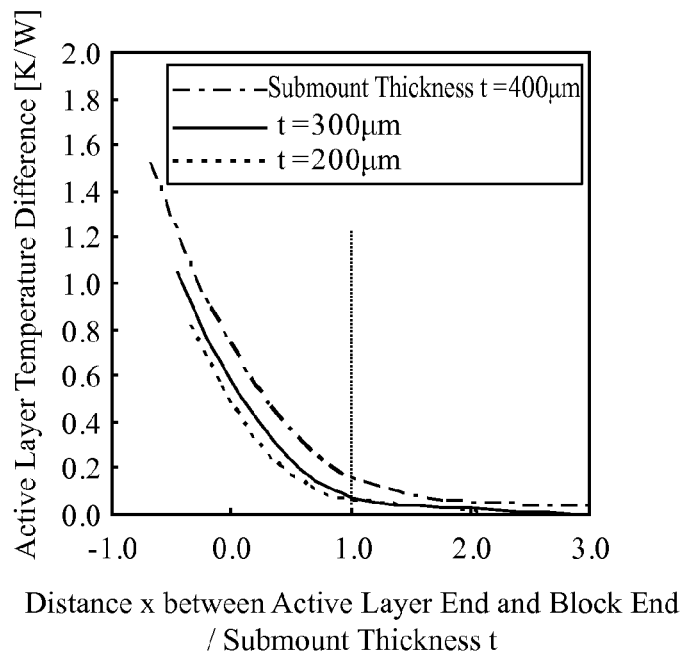
FIG. 9 is an explanatory diagram showing the results determined by thermal simulation of active layer temperature when thicknesses of a submount in the semiconductor laser device of Embodiment 2 of the invention are different.

FIG. 9 shows differences in temperature between the two active layers 3a and 3b based on the thermal simulation results of FIG. 8. The thermal simulation was carried out for the cases where the thermal conductivity of the submount 8 was set at 230 W/m·K, and the submount thicknesses were set at 200, 300, and 400 µm. Thus, it is indicated as follows: when x/t is larger, in other words, when the right end of the heat sink 9 is largely distant from the right end of the first opening 10a to the right side, x dependency of the temperature difference between the two active layers 3a and 3b is smaller. However, when x/t is smaller, in other words, as the right end of the heat sink 9 approaches the right end of the first opening 10a, the temperature difference rapidly increases. It is indicated that, for the temperature increase, the point of $x/t = 1.0$ is a border for each case of all the submount thicknesses.

Further, as x/t is smaller, the temperature difference is higher. Further, it is indicated as follows: even when x/t is negative, in other words, in the state in which the right end position of the heat sink 9 is situated on the further left side from the right end position of the first opening 10a, the temperature difference similarly increases.

From the above, it turns out that when the positional relationship between the right end of the first opening 10a and the submount right end is set at $x/t \leq 1.0$, and the positional relationship between the left end of the second opening 10b and the submount left end is set at $x/t > 1.0$, the active layer temperature on the first opening 10a can be set higher than the active layer temperature of the second opening 10b. In this manner, it becomes possible to obtain a laser oscillation beam with two wavelengths from the one element.

Further, from FIGS. 8 and 9, it is indicated that the condition for a rapid increase in the difference between the active layer temperatures, namely, $x/t \leq 1.0$, does not depend upon the submount thickness or the thermal conductivity of the submount. The reason why the value of x/t has a universality can be described as follows.

Figure 10:
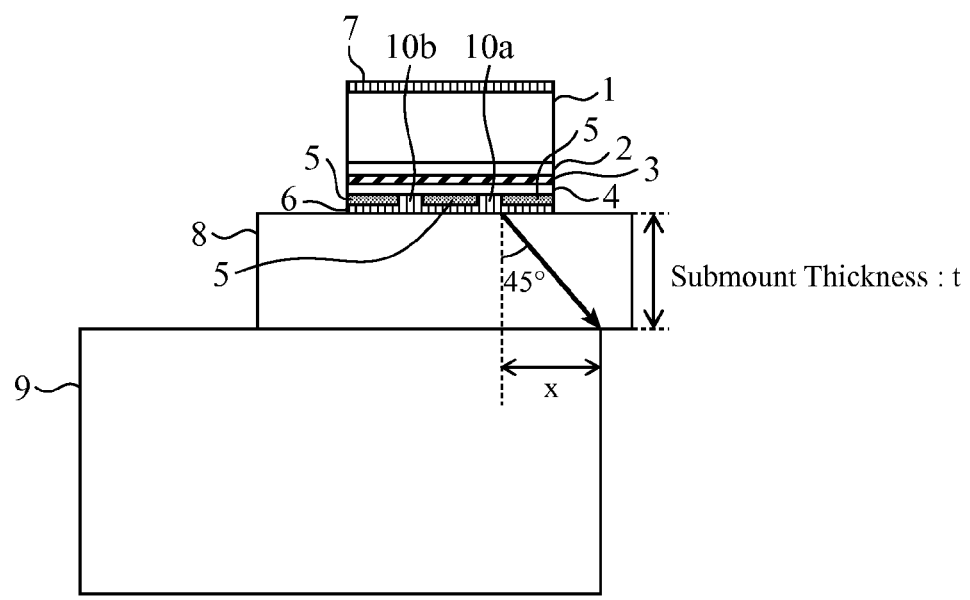
FIG. 10 is a constitution diagram for illustrating a reason for presence of a critical point in the semiconductor laser device of Embodiment 2 of the invention.

FIG. 10 is a constitution diagram of the device as seen from the front thereof when $x/t = 1.0$. Here, because the thermal conductivity of the submount 8 has an isotropy, the heat generated at the right end of the first opening 10a is diffused in the right lateral direction at a radiation angle of 45°. When the heat reaches the lower surface of the submount 8, in other words, when the heat is diffused in the downward direction by the distance of t, the heat sink 9 is not present at that position in the case where $x/t \leq 1.0$. Accordingly, the heat conduction becomes insufficient, so that the temperature of the active layer 3a becomes higher than that of the active layer 3b.

Then, the laser device as shown in FIG. 7 was manufactured. Each opening width of the first opening 10a and the second opening 10b was 100 µm, and the width of the laser element was 600 µm. The submount thickness was set at 240 µm. The distance between the opening end of the first opening 10a and the submount end was set at 70 µm. Thus, the opening end of the first opening 10a was set outside the submount end. In this case, x/t was $-70/240 = -0.29$.

Figure 11:
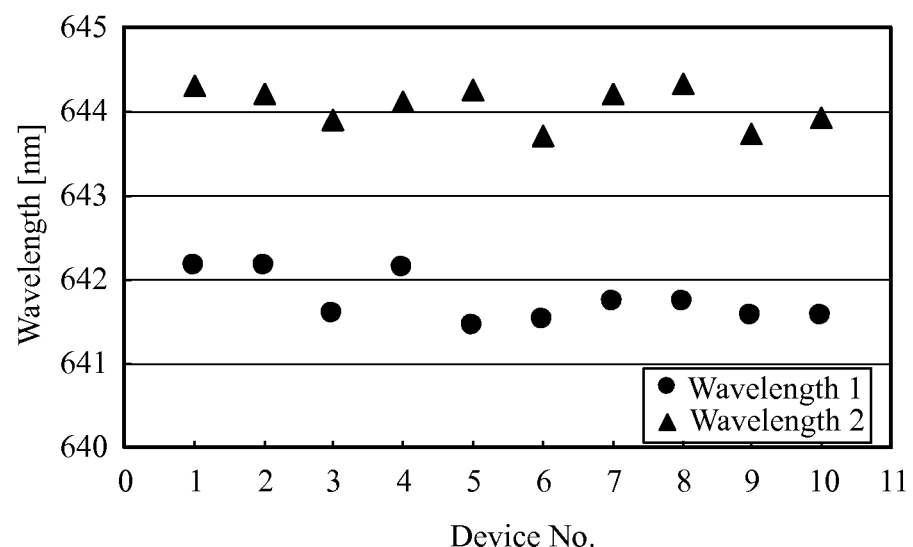
FIG. 11 is an explanatory diagram showing results of wavelength measurement in the semiconductor laser device of Embodiment 2 of the invention.
Figure 12:
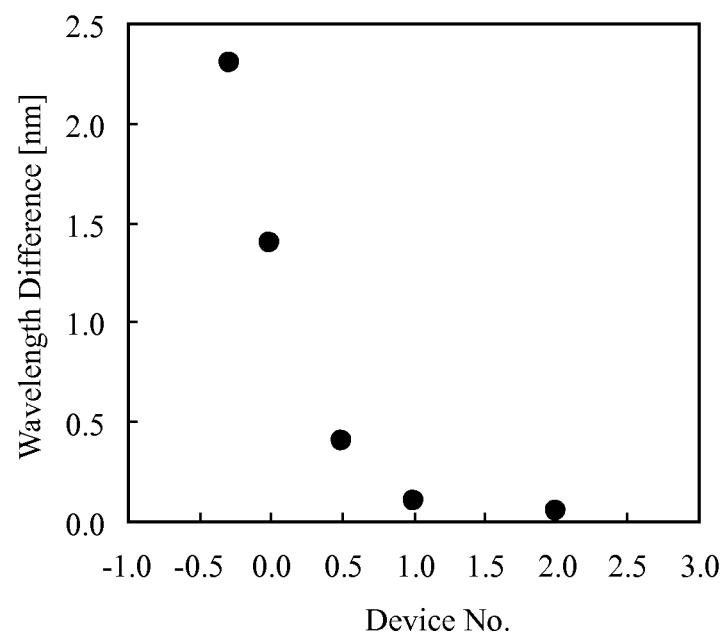
FIG. 12 is an explanatory diagram summarizing the results of the wavelength measurement in the semiconductor laser device of Embodiment 2 of the invention.

For the case where the ten laser devices described above were applied with a current of 6 A, the wavelengths of the laser beams generated from the two light emitting regions were measured using a fiber equipped with a lens. The measurement results of the respective wavelengths are shown in FIG. 11. The difference between the two wavelengths was an average of 2.3 nm. Similarly, a laser device was manufactured using x/t as a parameter, and the difference between the two wavelengths was measured, and the results are shown as shown in FIG. 12.

Thus, in accordance with the constitution of the device in the present embodiment, it becomes possible to obtain the two oscillation wavelengths from the one element. Further, also with the device constitution, the position of the submount 8 is just changed from the conventional one, which enables easy manufacturing thereof.

Further, if the material for the submount 8 has an anisotropy in thermal conductivity, in other words, if the horizontal thermal conductivity kx and the vertical thermal conductivity ky are different from each other, the heat conduction is effected not at 45° with respect to the vertical direction, but at an angle of:

$$\theta = \tan^{-1}(kx/ky) [\text{deg.}].$$

Therefore, in this case, the critical point x is expressed as follows with respect to the distance between the opening position and the submount end such that the temperature increase of the active layer 3 increases:

$$x = t \cdot \tan \theta = t \cdot (kx/ky)$$

where t denotes the submount thickness.

Incidentally, in the present embodiment, there is shown the example in a monolithic structure in which the two light emitting points are formed in the one laser element. However, the same also applies to a structure in which there are arranged two laser elements each including only one light emitting point formed therein. Further, in this case, the two laser elements may be arranged on one submount, or the one submount may be used for each laser element. Further, in the present embodiment, the description is given to the case of the two light emitting points. However, the same effects can be produced also when the element has a plurality of, three or more light emitting points.

As described above, according to the semiconductor laser device of Embodiment 2, the laser device is configured to include: the submount having the thermal conductivity of kx in the horizontal direction, and the thermal conductivity of ky in the vertical direction that is joined on the heat sink; and the laser element having the plurality of light emitting regions resulting from the plurality of openings for the single laser element, and being mounted on the submount such that the element side having the active layer faces the submount side, wherein in at least one opening of the plurality of openings, the following inequality is satisfied: $x/t \le t \cdot (kx/ky)$, where x represents the minimum distance in the horizontal direction between the opening end and the heat sink end, and t represents the submount thickness, and in at least one of the other openings different from the one opening, the following inequality is satisfied: $x > t \cdot (kx/ky)$. Accordingly, the semiconductor laser device capable of suppressing the speckle noise at low cost and with ease can be obtained.

Further, according to the semiconductor laser device of Embodiment 2, in place of the laser element having the plurality of light emitting regions in the single laser element, the plurality of laser elements each having the light emitting region resulting from the single opening for the laser element are provided on the submount, and the respective openings are set as the plurality of openings. Accordingly, even when the plurality of elements are used, the elements may have the same wavelength and thus, it becomes possible to reduce the element manufacturing cost.

Further, according to the semiconductor laser device of Embodiment 2, the laser device is configured to include: the submount having the isotropic thermal conductivity in the horizontal direction and the vertical direction that is joined on the heat sink; and the laser element having the plurality of light emitting regions resulting from the plurality of openings for the single laser element, and being mounted on the submount such that the element side having the active layer faces the submount side, wherein in at least one opening of the plurality of openings, the following inequality is satisfied: $x/t \le 1.0$, where x represents the minimum distance in the horizontal direction between the opening end and the heat sink end, and t represents the submount thickness, and in at least one of the other openings different from the one opening, the following inequality is satisfied: $x/t > 1.0$. Accordingly, the semiconductor laser device capable of suppressing the speckle noise at low cost and with ease can be obtained.

Incidentally, in the present invention, free combinations of respective embodiments, or modification of any constituent elements of respective embodiments, or omission of any constituent element in respective embodiments is possible within the scope of the invention.

INDUSTRIAL APPLICABILITY

As described above, the semiconductor laser device of the present invention is configured that when the temperature of the partial light emitting region in the laser element having the plurality of light emitting regions is set higher than that of the other light emitting region, the oscillation wavelength is made longer to thereby obtain the oscillation light having the plurality of wavelengths, and it is thus suitable for use in a light source of a projector device, or the like.

DESCRIPTION OF REFERENCE NUMERALS AND SIGNS

1: n-type GaAs substrate
2: n-type AlInP cladding layer
3: active layer
4: p-type AlInP cladding layer
5: SiN insulation film
6: p-side electrode
7: n-side electrode
8: submount
9: heat sink
10a: first opening
10b: second opening.

The invention claimed is:
1. A semiconductor laser device, comprising: a submount having a thermal conductivity of kx in a horizontal direction, and a thermal conductivity of ky in a vertical direction that is joined on a heat sink; and a laser element having a plurality of light emitting regions resulting from a plurality of openings for a single laser element, and being mounted on the submount such that a side of the element having an active layer faces a side of the submount, wherein in at least one opening of the plurality of openings, the following inequality is satisfied:

$$x \le \tfrac{1}{2} \cdot 1 \cdot t \cdot (kx/ky)$$

where x represents a minimum distance in the horizontal direction between an opening end of the one opening and an end of the submount, and t represents a thickness of the submount, and in at least one of the other openings different from the one opening, the following inequality is satisfied:

$$x > \tfrac{1}{2} \cdot t \cdot (kx/ky).$$

2. The semiconductor laser device according to claim 1, wherein the submount joined on the heat sink has an isotropic thermal conductivity.

3. The semiconductor laser device according to claim 1, wherein the plurality of laser elements are arranged on the submount to provide a plurality of light emitting points.

4. A semiconductor laser device, comprising: a submount having a thermal conductivity of kx in a horizontal direction, and a thermal conductivity of ky in a vertical direction that is joined on a heat sink; and a laser element having a plurality of light emitting regions resulting from a plurality of openings for a single laser element, and being mounted on the submount such that a side of the element having an active layer faces a side of the submount, wherein in at least one opening of the plurality of openings, the following inequality is satisfied:

$$x/t \le t \cdot (kx/ky)$$

where x represents a minimum distance in the horizontal direction between an end of the one opening and an end of the heat sink, and t represents a thickness of the submount, and in at least one of the other openings different from the one opening, the following inequality is satisfied:

$$x \le t \cdot (kx/ky).$$

5. The semiconductor laser device according to claim 4, wherein the submount joined on the heat sink has an isotropic thermal conductivity.

6. The semiconductor laser device according to claim 4, wherein the plurality of laser elements are arranged on the submount to provide a plurality of light emitting points.

* * * * *